June 22, 1965 SHAO C. FENG 3,191,057

CURRENT ADDER TYPE LOGIC CIRCUIT

Filed July 20, 1961 3 Sheets-Sheet 1

INVENTOR

SHAO C. FENG

BY Griffin and Stokes

ATTORNEYS

June 22, 1965 SHAO C. FENG 3,191,057
CURRENT ADDER TYPE LOGIC CIRCUIT
Filed July 20, 1961 3 Sheets-Sheet 3

United States Patent Office 3,191,057
Patented June 22, 1965

3,191,057

CURRENT ADDER TYPE LOGIC CIRCUIT

Shao C. Feng, Huntington, N.Y., assignor to Sperry Rand Corporation, New York, N.Y., a corporation of Delaware Filed July 20, 1961, Ser. No. 125,521
20 Claims. (Cl. 307—88.5)

This invention relates to a novel logic circuit, and more particularly, to an AND circuit utilizing solid state components including a reverse-biased semi-conductor device operating in its breakdown region.

Logical AND circuits (or gates) are extensively used in data processing equipment for the detection of coincidence between two or more input signals. When a high pulse repetition rate is desired for purposes of rapidly performing arithmetic and other operations in such equipment, the response time of such logical circuits must be fast so that there is little or no delay incurred therein between the application of the input signals and the generation of an output signal therefrom. Furthermore, as in all data processing equipment, the reliability of the components therein is a prime requisite together with the desideratum of low power consumption within the circuit.

The present invention provides all three of the above advantages by utilizing solid state components arranged in a novel configuration and including a semi-conductor device having a reverse breakdown potential characteristic for purposes of obtaining greater efficiency and a high speed response to the application of input signals thereto. Generally, this semi-conductor device is in series circuit with an impedance and is reverse-biased with a potential of such magnitude to cause the device to operate in its breakdown region and force a substantially large current therethrough in a direction opposite to its low resistance path. As long as the breakdown potential is applied across the semiconductor device, the potential drop thereacross is constant and relatively independent of the amount of current flowing therethrough. Each of the input signals applied to the circuit containing this reverse-biased device contributes to the current flowing through the series impedance, but decreases the current flow through the device by a predetermined amount such that the same total current remains in the impedance. Where N is the number of input terminals, $N-1$ input signals contribute all of the current in the impedance so that the device ceases operation in its breakdown region. At such time, the device becomes highly resistive to current flow in its reverse direction such that it constitutes an open circuit and thereby disconnects its biasing source from the series impedance. N input signals thereby may change the potential drop across the series impedance. An output device is responsive only to this new potential which differs from the constant potential observed when the device is operating in its breakdown condition. Since the extinguishing of the breakdown condition in the device is extremely fast, the coincidence of all input signals to the logical circuit results in an extremely short time delay between the application of the inputs and the generation of an output pulse indicating such coincidence.

It is therefore an object of the present invention to provide a logical AND circuit responsive to coincidence of all inputs for generating an output signal, with an extremely small time delay occurring therein.

Another object of the present invention is to provide a logical AND circuit having a fast response time that includes a semi-conductor breakdown device biased in the reverse direction and operating in its breakdown region.

A further object is to provide a logical AND circuit having a semi-conductor breakdown diode in series circuit with a resistance and reverse biased by a potential thereacross, such that the potential at the junction of the diode and resistance remains at a constant predetermined magnitude for the application of any number of input signals up to and including $N-1$, which is less than the number N of input terminals.

Another object of the present invention is to provide a logical AND circuit which is quite efficient.

These and other objects of the present invention will be apparent during the course of the following description, which is to be taken in conjunction with the drawings, in which.

Figure 5:
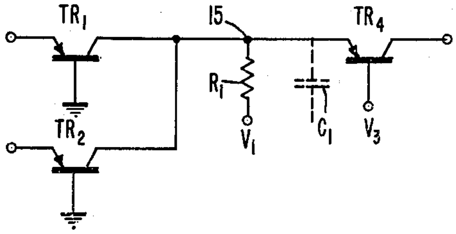

FIGURES *4a*, *4b*, and *4c* show an AND circuit of the prior art together with equivalent circuits thereof; and FIGURE 5 shows an equivalent circuit of the present invention.

Figures 1, 2:
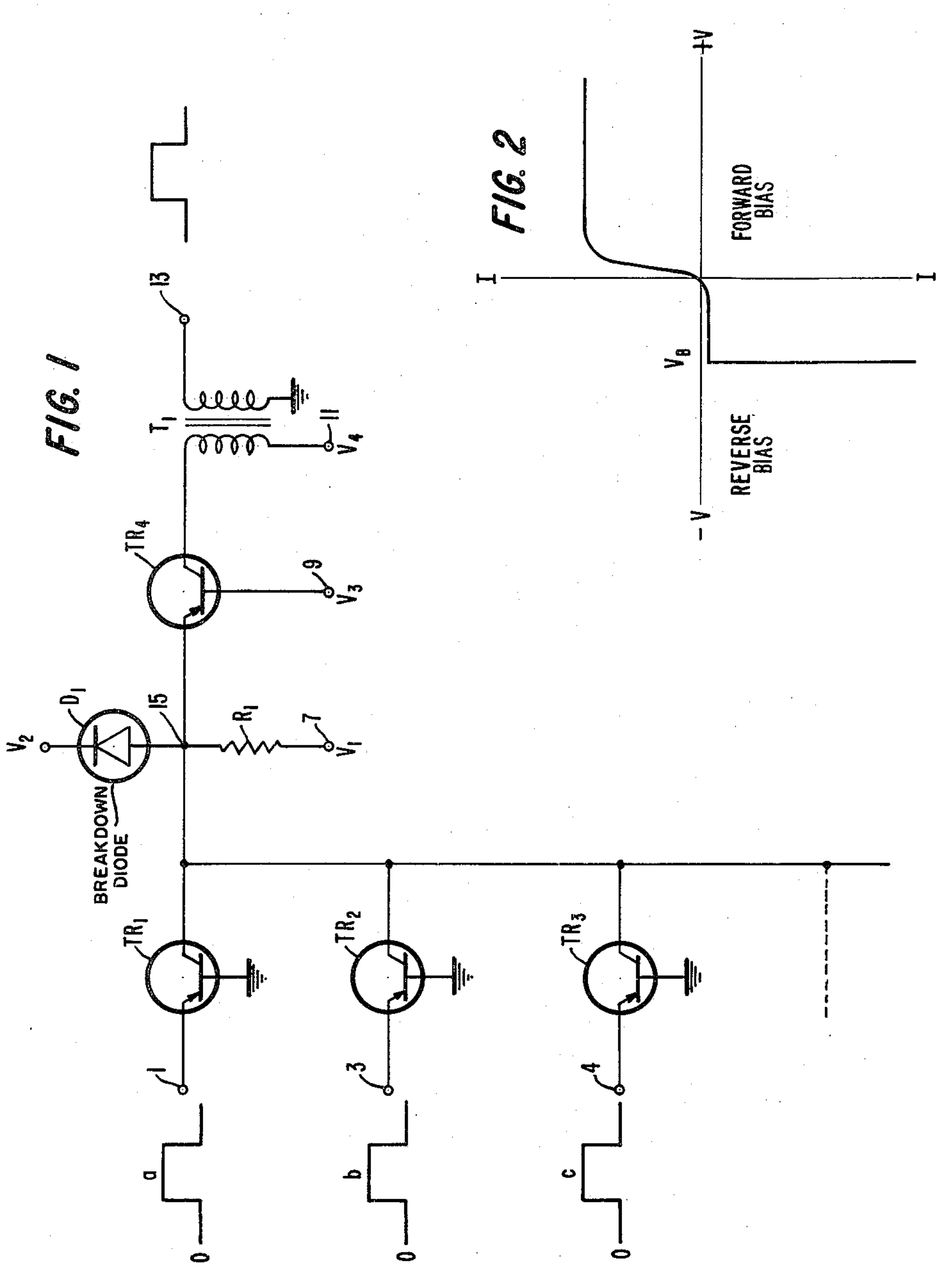
FIGURE 1 shows a preferred embodiment of the invention.
FIGURE 2 shows the forward and reverse characteristics of a semiconductor breakdown device of the kind described.

Turning now to FIGURE 1 of the drawings, a logical AND circuit is there shown which is constructed according to the novel features of the present invention. A number of input signals *a*, *b*, *c*, etc., the coincidence of which is desired to be indicated by an output from the circuit, are individually and respectively applied to the input terminals 1, 3, 4, etc. Although only three of these input terminals 1, 3, and 4 are actually shown in FIGURE 1, it is to be understood that the invention is not so limited, but may be expanded to determine the coincidence of N number of input signals, depending upon the logical requirements, where N is an integer of value 2 or greater. In the embodiment shown in FIGURE 1, the terminals 1, 3, 4, etc., respectively are connected to the emitter electrodes of the P-N-P transistors $TR_1$, $TR_2$, and $TR_3$. Each base electrode of these transistors is connected to a source of bias potential, which for purposes of the present discussion may be reference ground. Each collector electrode of the transistors, including the collector electrodes of any other input transistors not shown, are joined together and connected to a junction 15 existing between a semiconductor breakdown device $D_1$ and a resistor $R_1$, which are in series circuit with each other. As shown, the semiconductor breakdown device is a diode having both anode and cathode, with the anode of $D_1$ being connected to one terminal of resistor $R_1$ at junction 15. The device $D_1$ must be one having breakdown potential characteristic when biased in the direction of high resistance, which is that prevailing whenever its cathode is higher in potential than its anode, such that the voltage drop thereacross during breakdown operation is relatively constant and independent of current flow therethrough.

The reverse (as well as forward) V–I characteristic of a diode of the type described is shown in FIGURE 2. Normally, for reverse potential differences across the device up to a predetermined value $V_B$, there is substantially no current flow through the device because of the nature of its rectifying junction, as is well-known in the art. However, upon the reverse potential difference reaching a critical predetermined magnitude $V_B$, as determined by certain physical characteristics of the device itself, a breakdown of the junction occurs and a substantial current flow is initiated therethrough. If the device is in series circuit with an impedance, the potential drop across the device remains substantially constant at value $V_B$ during breakdown operation, no matter what the magnitude of the current through the series circuit may become. Therefore, a semi-conductor diode operating in its reverse breakdown region acts as a constant voltage clamp with respect to the voltage appearing across its terminals. A phenomenon know as "avalanche" breakdown of a semi-conductor rectifying junction results in this desired characteristic. A silicon diode may be used as the component $D_1$. Furthermore, devices other than diodes may be used if they have the required reverse breakdown characteristic above described.

Returning now to FIGURE 1, an output semi-conductor device, such as transistor $TR_4$, is provided with its emitter electrode connected to junction 15 between $D_1$ and $R_1$. The base electrode of $TR_4$ is connected to a source of bias potential $V_3$, while its collector electrode may be connected through the primary winding of a transformer $T_1$ to a source of potential $V_4$ which is negative with respect to $V_3$. With the change in current in the collector circuit of transistor $TR_4$, an output signal is induced in the secondary winding of $T_1$ and appears at output terminal 13.

A source of negative potential $V_1$ is applied to terminal 7 of resistor $R_1$, while a source of positive potential $V_2$ is supplied to terminal 5 of diode $D_1$. In the absence of any current flow in the collector circuits of transistors $TR_1$, $TR_2$, $TR_3$, and the like, the potential difference $V_2+V_1$ applied across the series combination of $D_1$ and $R_1$ is such as to cause $D_1$ to operate in its breakdown region so that there is a current flow therethrough and through resistor $R_1$. The potential difference at junction 15 with respect to ground may consequently be represented by $V_2-V_B$, where $V_B$ is the potential drop across diode $D_1$ during its breakdown operation. This potential at junction 15 may therefore be represented by the term $V_E$ which remains constant as long as $D_1$ operates in its breakdown region, or in other words, as long as $V_2-V_E=V_B$. The potential $V_3$ used to bias the base electrode of transistor $TR_4$ is adjusted such that its magnitude is the same as or is slightly above the voltage $V_E$, so that $TR_4$ is turned off and has substantially no current flow in its collector circuit. Therefore, $TR_4$ is just at the threshold of conduction.

The potential $V_E$ also acts as a biasing source for the collector circuits of transistors $TR_1$, $TR_2$, and $TR_3$. When no input signals *a, b, c*, etc. are present, the emitter electrodes of the transistors are held at a potential equal to or less than ground so as to result in the transistors being turned off. In this condition, little or no current flows in the collector circuits. Thus, in the absence of any input signals, current flows only through the series combination of $D_1$ and $R_1$ from potential $V_2$ to potential $V_1$. The potential $V_E$ at junction 15 is such as to maintain the collector-base junctions of $TR_1$, $TR_2$, and $TR_3$ in a reverse-biased condition.

If an input signal is applied to the emitter electrodes of any one of the transistors $TR_1$, $TR_2$, etc., the potential of this signal, for example signal *a*, is such as to bias the emitter-base junction of $TR_1$ in a forward direction so as to turn on $TR_1$ and provide a current in its collector circuit which flows to junction 15 and through $R_1$ back to the negative potential $V_1$. The magnitude of this current flow for a particular level of input signal *a* is assumed to be of value I. In like fashion, if a signal *b* of like level is applied instead to transistor $TR_2$, the current flowing in this collector circuit, which includes resistor $R_1$, is also of magnitude I. For purposes of physically describing the action of transistors $TR_1$, $TR_2$, and $TR_3$, it may be said that in the absence of an input signal thereto, a transistor effectively creates an open circuit in its collector electrode such that it contributes no current to that flowing in resistor $R_1$. However, upon application of an input signal to its emitter electrode, the transistor becomes a closed switch through which a current of magnitude I flows which thereupon contributes to the current in $R_1$. In the event that each of the transistors $TR_1$ and $TR_2$ contributes a current of magnitude I, these currents are summed together at junction 15 such that they contribute a total current of 2I to whatever current flows in resistor $R_1$.

In the absence of the actuation of any of the input transistors $TR_1$, $TR_2$, etc., the potentials of $V_2$ and $V_1$ are adjusted such that the current flow in the series circuit of $D_1$ and $R_1$, caused by $V_2+V_1$, is equal to the value of $(N-1)$I, where N is the total number of input terminals provided to the AND circuit. The value I is, of course, the current flowing in the collector circuit of a transistor actuated by an input signal at its emitter electrode.

Figure 3:
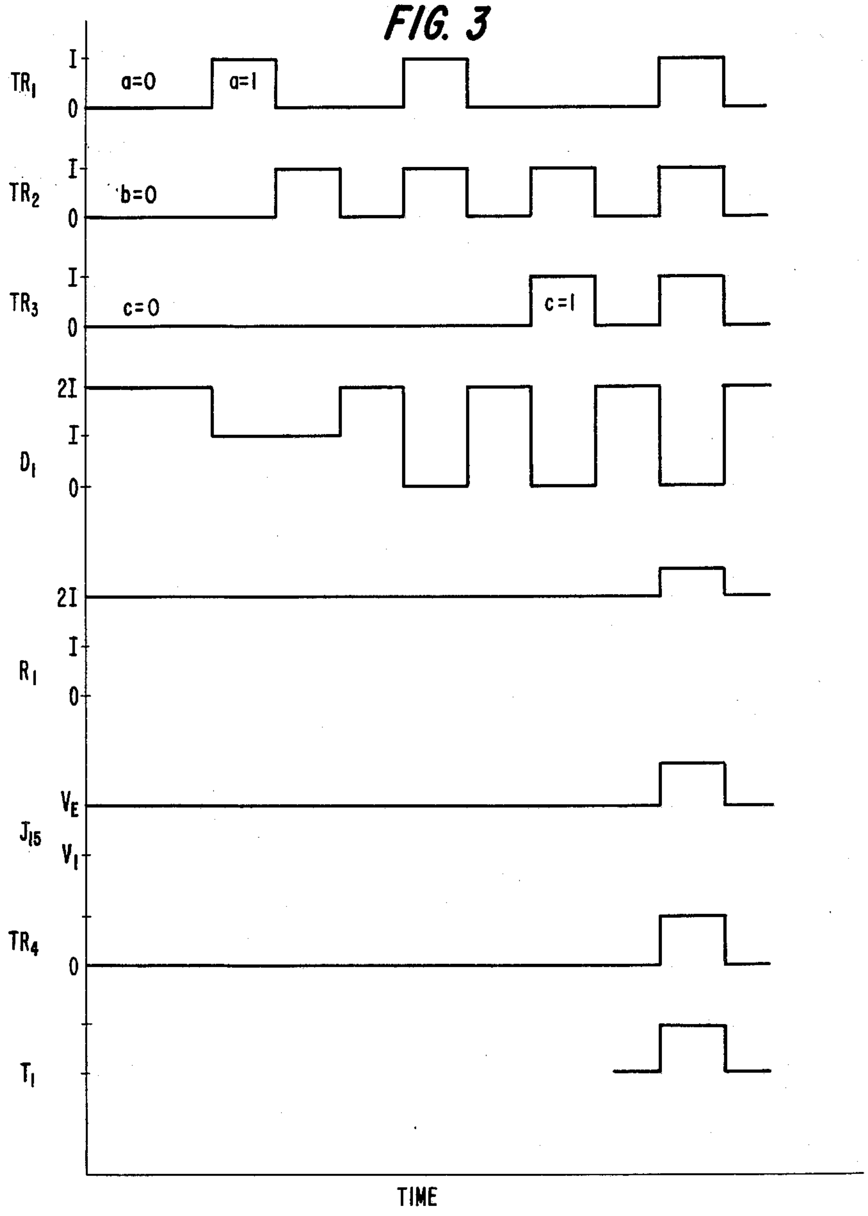
FIGURE 3 shows the current waveforms in the various circuit components during different periods of operation.

The circuit of FIGURE 1 operates as follows, with reference being made to FIGURE 3. First assume that the AND circuit has but three input terminals, 1, 3, and 4 so that the number N is equal to 3. Also, consider that if any one of the transistors $TR_1$, $TR_2$, or $TR_3$ is actuated, it contributes a current of magnitude I via its collector to junction 15 and through resistor $R_1$ back to negative potential $V_1$. Therefore, in the absence of any applied inputs *a, b*, or *c* to the emitter electrodes of the input transistors, the potentials $V_2$ and $V_1$ are adjusted such that diode $D_1$ operates in its reverse breakdown region with a current of magnitude (3−1)I flowing therethrough. This maintains a potential $V_E$ at junction 15. The potential $V_E$, when measured with respect to $V_1$, is equal to (2I)$R_1$, and is equal to or below that of potential $V_3$ such that transistor $TR_4$ remains unenergized. The potential across $D_1$ is given by $V_B$ (its breakdown voltage), such that $$V_B+V_E=V_1+V_2$$

Next assume that only one input signal, for example signal *a*, is applied to the input transistor group. In this event, the emitter electrode of $TR_1$ will be raised above its base potential such that a current of magnitude I is produced in its collector which flows from the collector to junction 15 of the series circuit. The return path of the $TR_1$ collector current is through $R_1$ where it contributes to the current therein due to that flowing through diode $D_1$. However, it is seen that the current flowing through diode $D_1$ must decrease to a value of I in order for the potential $V_B$ to be maintained across it. This is because an increase in current above a value 2I in resistor $R_1$ will raise the potential at junction 15 to a value $V_E'$ so that the potential across the diode $D_1$ would be less than $V_B$. Therefore, because the current flow through diode $D_1$ reduces to a value of I from its original value of 2I, the total current flowing through $R_1$ is the sum (2I) of current I from the $TR_1$ collector and current I from $D_1$. This is illustrated in FIGURE 3. The current 2I flowing through resistor $R_1$ thereby maintains the constant potential $V_E$ at junction 15 which thereby prevents the turning on of transistor $TR_4$.

The same operation described above would result if any one of the other transistors $TR_2$ or $TR_3$ is energized instead of $TR_1$. Thus, it may be seen that when only one out of the three input transistors is energized by an input signal appearing thereto, the current flowing through diode $D_1$ is reduced from a value of 2I to a value I while the current flow through $R_1$ maintains its steady 2I value, and transistor $TR_4$ does not generate a current in its collector output.

In the event that two input signals are applied to the input transistor group, the following action is observed. For example, assume that signals *a* and *b* are respectively applied to $TR_1$ and $TR_2$. Each transistor begins to conduct and thus generates a current I in its output collector circuit. These two currents are summed together at junction 15 and return to their respective transistors via resistor $R_1$. In so doing, the current through $D_1$ decreases to zero, which effectively means that it is operating in a high resistance region. As a practical matter, the circuit component values may be adjusted such that the sum of currents from any two actuated input transistors will be just sufficient to slightly raise the potential at junction 15 so that the minimum breakdown potential $V_B$ cannot be maintained across $D_1$, and it will consequently revert to its high resistance state. Therefore, only the current 2I contributed by $TR_1$ and $TR_2$ remains in $R_1$. This current 2I through $R_1$ maintains the previous voltage $V_E$ (or one very slightly above) such that transistor $TR_4$ continues to be inoperative and does not therefore produce an output signal. In other words, upon application of any two input signals to the logical AND circuit, the reverse breakdown operation of diode $D_1$ is actually or effectively extinguished. However, a current flow 2I is still maintained through resistor $R_1$ because of the respective contributions of currents I from the input transistors which are summed together at junction 15. This, therefore, means that the potential $V_E$ is substantially maintained at junction 15 and does not allow conduction in the output transistor $TR_4$. Therefore, it is noted that the application of none, one, or two input signals to a three input logical AND circuit does not result in an output signal being generated therefrom.

Assuming now that all three inputs signals *a*, *b*, and *c* are applied to their respective input transistors, the following action results. As noted above, the conduction of but two transistors results in diode $D_1$ being returned to its high resistance region, such that an open circuit substantially appears between junction 15 and potential $V_2$. Conduction in the third input transistor also contributes a current I to junction 15 and through $R_1$ to potential $V_1$. Thus, when all three input signals are present, $R_1$ has a current flow therethrough of magnitude 3I. Because a larger current now flows through $R_1$, the potential at junction 15 may be expressed by the value $V_E'$ such that $V_E' > V_E$. The value of bias potential $V_3$ connected to the base of $TR_4$ is such that $V_E' > V_3$, which forward biases the emitter-base junction and causes the transistor to conduct. A current flow is thereby initiated in the collector circuit of $TR_4$ which in turn induces a current pulse in the secondary winding of transformer $T_1$. If a steady state output signal is desired from the AND circuit as long as the coincidental input signals are present, then the output may be obtained from the collector of $TR_4$ instead of from the secondary winding of $T_1$.

An analysis may be carried out as above described for a circuit having any number $N \geqslant 2$ of input terminals. Therefore, when a number of input signals zero through $N-2$ are present at the input terminals, diode $D_1$ maintains operation in its breakdown region although the current flow therethrough becomes progressively smaller as number of actuated input transistors becomes larger. When $N-1$ input signals are present at the input terminals, the breakdown condition of diode $D_1$ effectively ceases and no current flows therethrough, although the potential $V_E$ at junction 15 remains less than the potential required to initiate conduction in $TR_4$. Upon the coincidence of all N input signals, the current flow through $R_1$ becomes sufficient to generate a potential $V_E'$ at junction 15 which in turn forward biases the emitter-base junction of $TR_4$ so as to generate current in its collector circuit. The change of state of $D_1$ from that of conduction to that of high resistance is accomplished quite rapidly so that an ideal step function waveform is applied to the emitter of $TR_4$.

The speed with which transistor $TR_4$ responds to the step function voltage applied to its emitter depends upon many factors, such as its load impedance, inherent speed, and the operating conditions just prior to application of the input signal. With regard to the latter two factors, one important parameter to consider in the transient response time of a transistor is the emitter capacitance which must be charged by the step wave to a value such as to make the emitter higher in potential than the base. The time delay encountered in this operation depends upon the time constant of the capacitor charging circuit, which in turn is affected by the value of the impedance in said charging circuit. The present invention reduces this time constant by effectively lowering the value of the source impedance over that usually found in the typical prior art. In addition, this low impedance of the source also reduces the effective emitter capacitance since generally a high impedance circuit has sufficient inherent capacitance so as to make its operation slower than a circuit having a low impedance.

Figure 4A:
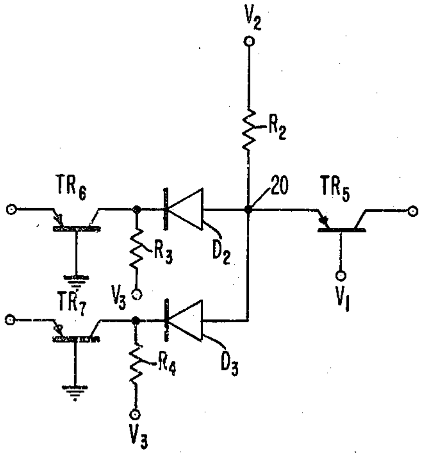
FIG. 4a PRIOR ART
Figure 4B:
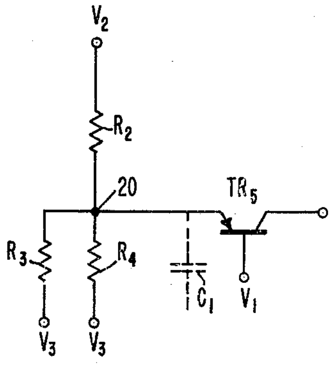
Figure 4C:
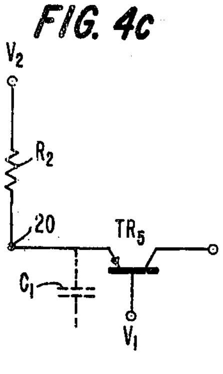

The above described advantages of the present invention are illustrated in FIGURES 4 and 5 of the drawings, which respectively show a typical prior art logical AND circuit and the equivalent circuit of the present invention shown in FIGURE 1. Referring to FIGURE 4*a*, there is shown an AND circuit in which the detection of coincidence between two input signals is performed by diode logic. Input transistor $TR_6$ and $TR_7$ have their collectors respectively connected to resistors $R_3$ and $R_4$, which in turn are biased with potential $V_3$. Diodes $D_2$ and $D_3$ are connected respectively between a common junction 20 and the collectors of transistors $TR_6$ and $TR_7$, with a polarity as shown. A resistor $R_2$ is connected between junction 20 and potential $V_2$, while an output transistor $TR_5$ has its emitter also connected to junction 20. In operation, potential $V_2$ is higher than potential $V_3$ such that diodes $D_2$ and $D_3$ are forward biased in the absence of signals to their respective input transistors. In this case, current in the positive direction flows through resistor $R_2$ and divides through resistors $R_3$ and $R_4$ so as to make common junction 20 lower in potential than the biasing potential $V_1$ connected to the base of the output transistor. The approximate equivalent circuit at this time is shown in FIGURE 4*b*. The emitter capacitance $C_1$ is shown by dotted lines, and its upper plate is maintained at a potential equal to that at common junction 20. Upon either one of the input transistors receiving a signal, the current flow in its collector through its collector through its load resistor reverse biases its associated diode so as to effectively disconnect its load from the circuit path above described. However, both diodes $D_2$ and $D_3$ must be reverse biased by input signals before the potential at junction 20 can rise to a value positive with respect to $V_1$. This latter condition is shown in the approximate equivalent circuit of FIGURE 4*c* wherein it is indicated that resistors $R_3$ and $R_4$ are effectively disconnected from input circuit of $TR_5$. However, the emitter voltage does not rise instantaneously because of the negative charge (with respect to $V_1$) held by capacitor $C_1$. The charging path for $C_1$ in this case includes resistor $R_2$ from source potential $V_2$, which means that a finite time delay is encountered before the emitter of $TR_5$ becomes forward biased.

FIGURE 5 shows the approximate equivalent circuit of the present invention during the time that input signals are simultaneously applied to all of the AND gate terminals. However, FIGURE 5 assumes, for purposes of simplicity, that the AND gate of FIGURE 1 has only input transistors $TR_1$ and $TR_2$. Upon signals being applied to both, the control voltage $V_2$ in FIGURE 1 is disconnected from transistor $TR_4$ input circuit such that a charging path for the emitter capacitor $C_1$ is completed through input transistors $TR_1$ and $TR_2$. The only impedance in this charging circuit is that encountered within the input transistor bodies themselves, which is normally lower than the impedance presented by $R_2$ in FIGURE 4*c*. Thus, the time constant of the emitter capacitor charging circuit is reduced by the present invention which thereby decreases the response time of the output transistor to a step voltage waveform, Therefore, the configuration of the present invention not only supplies an ideal step waveform input to the output transistor, it effectively reduces the impedance of the waveform source so as to lessen the time delay encountered between application of the input signal to $TR_4$ and the initiation of collector output current therefrom.

In addition to the above described desirable characteristics of the present invention, the circuit can be designed so that the input transistors $TR_1$, $TR_2$, etc, never operate in a saturated condition even when input signals are simultaneously applied thereto. Thus, the collector voltage of an input transistor never falls below its base voltage and the base-collector diode therein consequently never becomes forward biased. Thus, there is no stored charge of carriers in the base region of the input transistor. Upon termination of an input signal thereto, the collector current from an input transistor $TR_1$, etc. immediately begins to fall without exhibiting the well known storage delay effect. Thus, the operation of the input transistors in their nonsaturated condition at all times allows a high input pulse repetition rate due to the fast recovery time of the circuit. The logical AND circuit of FIGURE 1 may be provided with any number of input terminals. It is also evident that the transistors may be of the N-P-N type instead of the P-N-P type shown. In such event, the diode $D_1$ is reversed in polarity so that its cathode is connected to junction 15, and potentials $V_2$ and $V_1$ are likewise reversed in polarity. This implies, therefore, that the input signals *a, b, c,* etc., are also reversed in polarity so as to cause the emitter-base junctions of the transistors to be biased in the forward direction. Transformer $T_1$ may also be omitted if desired. Other configurations utilizing the novel teachings disclosed herein are those having base drive inputs to the transistors instead of emitter drive. Thus, many modifications and alterations to the preferred embodiment of FIGURE 1 will be apparent to one skilled in the art, without departing from the spirit of the invention as defined in the appended claims.

I claim:

1. A logic circuit comprising: a semiconductor device having a reverse substantially constant potential breakdown characteristic between first and second terminals thereof, an impedance connected in series with said first terminal of said device with a junction formed therebetween, a potential applied across said series combination with polarity and magnitude such as to cause said device to operate in its reverse breakdown condition and pass a current of maximum magnitude $I_D$ therethrough so as to generate a first potential at said junction, a group of N input means, where N is an integer of value 2 or greater, each connected to said junction and each individually selectively actuated to apply a current of magnitude I to said impedance in the same direction as that of current $I_D$, where $I_D=(N-1)I$, in order that said first potential is substantially produced at said junction for any number of actuated input means up to and including $(N-1)$, while a second potential is produced at said junction for a number of actuated first means, equal to N, and means connected to said junction for generating an output signal in response only to said second potential produced at said junction.

2. A logic circuit according to claim 1 in which said semiconductor device is a silicon breakdown diode.

3. A logic circuit according to claim 2 in which the said first and second terminals of said diode are its anode and cathode, respectively.

4. A logic circuit according to claim 1 in which each of said input means is a transistor having a first electrode connected to said junction, a second electrode connected to a first bias potential, and a third electrode responsive to an input signal individual thereto for actuating the transistor to supply said current I to said impedance.

5. A logic circuit according to claim 4 in which said semiconductor device is a silicon breakdown diode.

6. A logic circuit according to claim 4 in which said first electrode of each transistor is the collector, said second electrode is the base, and said third electrode is the emitter.

7. A logic circuit according to claim 6 in which said semiconductor device is a silicon breakdown diode.

8. A logic circuit according to claim 7 in which the said first and second terminals of said diode are its anode and cathode, respectively.

9. A logic circuit according to claim 7 in which each transistor is of the P-N-P type, and the said first and second terminals of said diode are its anode and cathode, respectively.

10. A logic circuit according to claim 4 in which said output means is a transistor having a first electrode connected to an output load, said transistor further having a second electrode connected to a second bias potential and a third electrode connected to said junction.

11. A logic circuit according to claim 10 in which said semiconductor device is a silicon breakdown diode.

12. A logic circuit according to claim 11 in which said first electrode of each transistor is the collector, said second electrode is the base, and said third electrode is the emitter.

13. A logic circuit according to claim 12, in which each transistor is of the P-N-P type, and said first and second terminals of said diode are its anode and cathode, respectively.

14. A logic circuit comprising: a semiconductor device having a reverse substantially constant potential breakdown characteristic between first and second terminals thereof, an impedance connected in series with said first terminal of said device with a junction formed therebetween, a potential applied across said series combination with polarity and magnitude such as to cause said device to operate in its reverse breakdown condition and pass a current of maximum magnitude $I_D$ therethrough so as to generate a first potential at said junction, a group of N input means, where N is an integer of value 2 or greater, each connected to said junction and each individually selectively actuated to apply a current of magnitude I to said impedance in the same direction as that of current $I_D$, where $I_D=(N-1)I$, in order that said first potential is substantially produced at said junction for any number of actuated input means up to and including $(N-1)$, while a second potential is produced at said junction for a number of actuated first means, equal to N, and a transistor having a first electrode connected to an output load, said transistor further having a second electrode connected to a first bias potential and a third electrode responsive only to said second potential at said junction for producing an output signal.

15. A logic circuit according to claim 14 in which said semiconductor device is a silicon breakdown diode.

16. A logic circuit according to claim 14 in which said first electrode is the collector, said second electrode is the base, and said third electrode is the emitter.

17. A logic circuit according to claim 16 in which said semiconductor device is a silicon breakdown diode.

18. A logic circuit comprising: a semiconductor device having a reverse substantially constant potential breakdown characteristic between first and second terminals thereof, an impedance connected in series with said first terminal of said device with a junction formed therebetween, a potential applied across said series combination with polarity and magnitude such as to cause said device to operate in its reverse breakdown condition and pass a current of maximum magnitude $I_D$ therethrough so as to generate a first potential at said junction, and a group of N input means, where N is an integer of value 2 or greater, each connected to said junction and each individualy selectively actuated to apply a current of magnitude I to said impedance in the same direction as that of current $I_D$, where $I_D=(N-1)I$, in order that said first potential is substantially produced at said junction for any number of actuated input means up to and including (N—1), while a second potential is produced at said junction for a number of actuated first means, equal to N.

19. A logic circuit according to claim 18 in which said semiconductor device is a breakdown diode.

20. A logic circuit according to claim 18 in which each of said input means is a transistor having a first electrode connected to said junction, a second electrode connected to a first bias potential, and a third electrode responsive to an input signal individual thereto for actuating the transistor to supply said current I to said impedance.

References Cited by the Examiner

UNITED STATES PATENTS

| | | | |
|---|---|---|---|
| 2,906,941 | 9/59 | Brolin | 307—88.5 |
| 2,932,783 | 4/60 | Mohler | 307—88.5 |
| 2,963,698 | 12/60 | Slocomb | 307—88.5 |
| 2,980,845 | 4/61 | Thompson et al. | 307—88.5 |
| 3,114,052 | 12/63 | Rowe | 307—88.5 |

FOREIGN PATENTS

| | | |
|---|---|---|
| 598,597 | 5/60 | Canada. |

OTHER REFERENCES

Hurley: Junction Transistor Electronics, Wiley and Sons, 1958 (2nd printing 1959) (page 399 relied on).

Army TM-11-690, Dept. of Army, 1959 (pages 47 and 48 relied on).

ARTHUR GAUSS, *Primary Examiner.*

GEORGE N. WESTBY, *Examiner.*